(12) United States Patent
Pas

(10) Patent No.: US 6,780,250 B2
(45) Date of Patent: Aug. 24, 2004

(54) SYSTEM AND METHOD FOR INTEGRATED OXIDE REMOVAL AND PROCESSING OF A SEMICONDUCTOR WAFER

(75) Inventor: Sylvia H. Pas, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 431 days.

(21) Appl. No.: 09/758,610

(22) Filed: Jan. 11, 2001

(65) Prior Publication Data

US 2001/0031556 A1 Oct. 18, 2001

Related U.S. Application Data

(60) Provisional application No. 60/178,647, filed on Jan. 28, 2000.

(51) Int. Cl.[7] .................. C23C 16/00; C65G 49/07; C23F 1/00
(52) U.S. Cl. ............. 118/719; 156/345.31; 156/345.32; 414/936
(58) Field of Search .................... 414/936; 118/719; 156/345.31, 345.32

(56) References Cited

U.S. PATENT DOCUMENTS

| | | | | |
|---|---|---|---|---|
| 4,883,020 A | * | 11/1989 | Kasai et al. ................. | 118/719 |
| 5,236,868 A | * | 8/1993 | Nulman ....................... | 438/653 |
| 5,303,671 A | * | 4/1994 | Kondo et al. ................ | 118/719 |
| 5,474,641 A | * | 12/1995 | Otsuki et al. ................ | 438/694 |
| 5,609,689 A | * | 3/1997 | Kato et al. ................... | 118/719 |
| 5,695,564 A | * | 12/1997 | Imahashi ..................... | 118/719 |
| 5,972,161 A | * | 10/1999 | Kim et al. ............. | 156/345.31 |
| 6,143,081 A | * | 11/2000 | Shinriki et al. ............. | 118/719 |
| 6,178,660 B1 | * | 1/2001 | Emmi et al. .................. | 34/412 |
| 6,467,491 B1 | * | 10/2002 | Sugiura et al. .............. | 134/1.3 |

FOREIGN PATENT DOCUMENTS

| | | | | | |
|---|---|---|---|---|---|
| JP | 61054628 A | * | 3/1986 | ......... | H01L/21/302 |
| JP | 05217919 A | * | 8/1993 | ......... | H01L/21/205 |
| JP | 09157073 A | * | 6/1997 | .......... | C04B/41/87 |
| JP | 2000323425 A | * | 11/2000 | .......... | H01L/21/26 |

OTHER PUBLICATIONS

Applied Materials Presentation, Jun. 19, 2002.

* cited by examiner

*Primary Examiner*—Parviz Hassanzadeh
*Assistant Examiner*—Karla Moore
(74) *Attorney, Agent, or Firm*—Rose Alyssa Keagy; W. James Brady, III; Frederick J. Telecky, Jr.

(57) ABSTRACT

An integrated oxide removal and processing system (10) includes a process module (30) that may intentionally add at least one film layer to a single semiconductor wafer (32). The integrated oxide removal and processing system (10) also includes a transfer chamber module (20) used to align the semiconductor wafer (32) for the process module (30). The transfer chamber module (20) may expose the semiconductor wafer (32) to a vaporous solution that is inert with respect to the semiconductor wafer (32) and operable to remove an oxide layer (110) therefrom. More specifically, the semiconductor wafer (32) includes silicon. In a further embodiment, the vaporous solution includes HF. In yet a further embodiment, the vaporous solution includes 0.049% to 49% HF.

13 Claims, 2 Drawing Sheets

SYSTEM AND METHOD FOR INTEGRATED OXIDE REMOVAL AND PROCESSING OF A SEMICONDUCTOR WAFER

This application claims priority under 35 USC §119(e)(1) of provisional application Nos. 60/178,647 filed Jan. 28, 2000.

TECHNICAL FIELD OF THE PRESENT INVENTION

This invention relates generally to the field of semiconductor processing and more particularly to a system and method for integrated oxide removal and processing of a semiconductor wafer.

BACKGROUND OF THE PRESENT INVENTION

Conventional process systems used in the production of microelectronic devices usually include a process module that utilizes a transfer chamber or loadlock module to align and/or center a semiconductor wafer to improve and/or monitor the accuracy of film processing. The process module is used for the purpose of intentionally growing and/or depositing layers of film onto a semiconductor wafer. Each step in the process system requires interfacing between modules to ensure quality of the microelectronic device and provides an opportunity for an oxide layer to form or re-form on the wafer.

The presence of an oxide layer with an unknown composition usually affects both electrical as well as physical properties of the film being deposited or grown, reducing the quality of the microelectronic device. For example, these layers may inhibit good contact with a silicon (Si) substrate, leading to poor epitaxial Si growth. They may also reduce a resultant dielectric quality, resulting in lower capacitance and current leakage in the microelectronic device. In polysilicon films, these layers may result in higher resistance than expected, thus affecting the operation of the microelectronic circuit. Furthermore, the layers may reduce the uniformity of film layers as well as undesirably increase the final thickness of the microelectronic device.

One approach to the oxide removal problem includes the use of high temperature processing within the processing module. For example, the surface of a wafer may be etched using a hydrogen anneal or baking process at a high temperature. However, this process requires the use of high temperatures and typically results in a non-uniform surface and/or potential damage to the wafer. Moreover, each of these processes requires either separate equipment or an additional step in processing. This additional step undesirably introduces an opportunity for further oxidation to occur.

Because hardware such as stainless steel or quartz within either a high quality thermal process or transfer chamber module are incompatible with any gas or etch process, approaches to the oxide removal problem typically include use of a separate oxide layer removal module. For example, a separate wet etch module may be used to remove an oxide layer from a wafer by immersing the wafer into a solution, such as hydrofluoric acid (HF). However, this type of processing is difficult to control and typically produces an undesirably uneven wafer surface. Other approaches may utilize a separate module for coating either a single wafer or a batch of wafers with a vaporous solution. However, each of these approaches undesirably introduces an additional step or interface into the process system. Therefore, it is desirable to ensure the effective removal of interfacial oxides without introducing unnecessary steps into the processing of semiconductor wafers.

SUMMARY OF THE PRESENT INVENTION

From the foregoing, it may be appreciated that a need has arisen for providing an efficient method for effectively removing layers of interfacial oxide from a semiconductor wafer. In accordance with the present invention, a system and method for integrated oxide removal and processing of a semiconductor wafer are provided that substantially eliminate or reduce disadvantages and problems of conventional systems.

According to an embodiment of the present invention, there is provided an integrated oxide removal and processing system that includes a process module that may intentionally add at least one film layer to a single semiconductor wafer. The integrated oxide removal and processing system also includes a transfer chamber module used to align the semiconductor wafer for the process module. The transfer chamber module may expose the semiconductor wafer to a vaporous solution that is inert with respect to the semiconductor wafer and operable to remove an oxide layer therefrom. More specifically, the semiconductor wafer includes a Si substrate. In a further embodiment, the vaporous solution includes hydrofluoric acid (HF). In yet a further embodiment, the vaporous solution includes 0.049% to 49% HF.

The present invention provides several important technical advantages over conventional systems. Various embodiments of the present invention may include none, some, or all of these advantages. One technical advantage of the present invention is that it may reduce the number of processing steps required to create a microelectronic device. This advantage may further reduce the occurrence of subsequent oxidation after a first oxide layer removal. Another technical advantage of the present invention is that it reduces interfaces between separate modules in semiconductor wafer processing systems and thus reduces system complexity. Yet another technical advantage of the present invention is that it provides control over the oxide removal process, thereby reducing a risk of detrimental affects on electrical and physical properties of the film being deposited or grown.

Yet another technical advantage of the present invention is that it may provide improved electrical contact to subsequent films grown or deposited on a semiconductor wafer. Another technical advantage of the present invention is that it may be done at room temperature rather than at a high temperature and does not require reduced pressure to remove chemical oxide layers. Yet another technical advantage of the present invention is that it may reduce the final thickness of the microelectronic device. Yet another technical advantage of the present invention is that it may reduce the processing time necessary to create the microelectronic device. Other technical advantages may be readily ascertainable by those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE DRAWINGS

Figure 1:
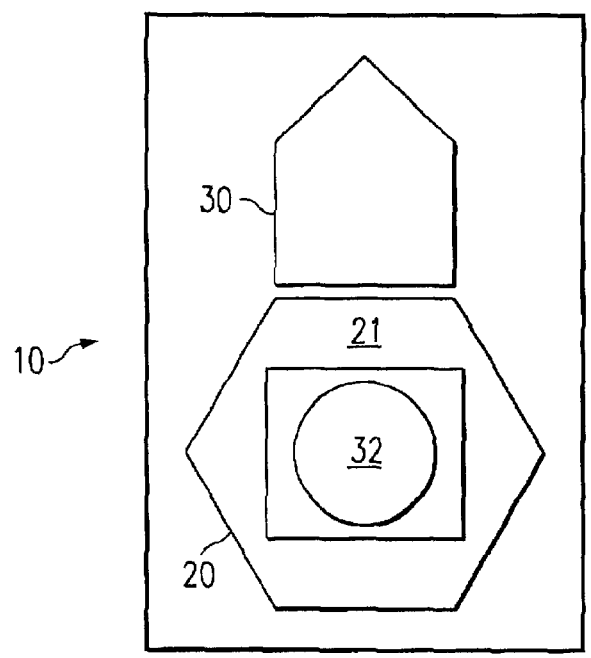
FIG. 1 illustrates an embodiment of an integrated oxide removal and processing system.

FIG. 1 illustrates an example block diagram of an integrated oxide removal and processing system. Integrated oxide removal and processing system 10 includes a transfer chamber oxide removal portion 20 and a process module 30. Transfer chamber oxide removal module 20 may be used as both a staging or loadlock area for process module 30 and as an etching chamber for semiconductor wafer 32 before semiconductor wafer 32 enters process module 30. For purpose of this specification, the term semiconductor wafer may be used to include a substrate, a combination of a substrate with one or more film layers, and/or any portion of the microelectronic device that may be subject to interfacial oxide layer formation and upon which one or more film layers may be intentionally grown or deposited.

Transfer chamber oxide removal module 20 may be used to remove an oxide layer from semiconductor wafer 32 by exposing semiconductor wafer 32 to a variety of vaporous solutions, depending on the desired application. For example, one type of oxide layer that may be formed on semiconductor wafer 32 may be a native oxide. Native oxides may be impure where the oxide includes nitrogen, carbon, or other elements. Another type of oxide may be a chemical oxide that may have been deposited or grown on semiconductor wafer 32. Where semiconductor wafer 32 includes silicon (Si), it may be desirable to use hydrofluoric acid (HF) to remove a variety of these oxide compositions. In some applications, the vaporous solution may include a mixture of elements. For example, a mixture of hydrochloric acid (HCl) and HF may be operable to remove interfacial oxide layers that include metallic impurities. The vaporous solution may be used in transfer chamber oxide removal module 20 to remove an oxide layer from semiconductor wafer 32 at or near room temperature, and thus requires no additional heating or reduced pressure.

As a staging area for process module 30, transfer chamber oxide removal module 20 is used to center and/or align semiconductor wafer 32 by using hardware 21. For example, semiconductor wafer 32 is typically marked for alignment with a reference point such as a notch or flat side. Centering and aligning semiconductor wafer 32 improves uniformity of film layer growth, deposition, etc., and permits monitoring of subsequent processing steps. Typically, hardware 21 includes a transfer mechanism—usually a robotic arm—(not explicitly shown) that is used to place semiconductor wafer 32 into transfer chamber oxide removal module 20 through a suitable opening, such as a closeable slit. After oxide removal is completed, the same or a different transfer mechanism is used to transfer semiconductor wafer 32 from transfer chamber oxide removal module 20 to process module 30.

This dual use for transfer chamber oxide removal module 20 may reduce the number of processing steps needed to create a microelectronic device as well as reduce the delay in processing semiconductor wafer 32. This reduction in delay may reduce the time for and/or the ability of interfacial oxide layers to re-form and may increase the probability that the surfaces of semiconductor wafer 32 are oxide-free, resulting in a higher quality microelectronic device. In some applications, transfer chamber oxide removal module 20 may remove an interfacial oxide layer from semiconductor wafer 32 while process module 30 is processing another semiconductor wafer 32. Such a configuration requires no additional chamber or process space, and may also reduce the processing time for creating the microelectronic device. Transfer chamber oxide removal module 20 is discussed in further detail in conjunction with FIG. 2.

Process module 30 may be used for the purpose of intentionally growing or depositing various layers of film on semiconductor wafer 32. Process module 30 may be used with a variety of wafers 32, including those composed of pure crystal and various compounds. For example, wafers 32 may include, but are not limited to, silicon (Si), polysilicon, amorphous silicon, gallium arsenide (GaAs), and other Group III/V semiconductor compounds. One or more layers of a variety of film types may be added to semiconductor wafer 32. For example, film layers that may be added to a Si semiconductor wafer 32 include, but are not limited to, $SiO_2$, epitaxial Si, polysilicon, nitrides, and gate dielectric films such as tantalum pentoxide ($Ta_2O_5$).

Process module 30 may use a variety of known methods to intentionally grow, and/or deposit one or more film layers onto semiconductor wafer 32. For example, rapid thermal processing may be used for high quality thin films, such as gate oxides or gate dielectrics. Rapid thermal processing systems typically control the stoichiometry of the resultant film, because the quality of the resultant microelectronic device is highly dependent on proper film processing. For example, the microelectronic device may be detrimentally affected by film layers that may be too thick or include impurities. To avoid such results, rapid thermal processing ensures that uniformity and/or a particular molecular arrangement of the film is maintained.

Process module 30 may also utilize chemical vapor deposition to intentionally add one or more films to the substrate. Chemical vapor deposition is typically used where the quality or thickness of the film is not important to the operability or quality of the resultant microelectronic device or the requirement for process is lower temperature than for thermal process. The types of vapors that may be used to deposit materials on each of these substrates may vary according to the application and to the substrate. A Si substrate is used to illustrate one aspect of the present invention.

Figure 2:
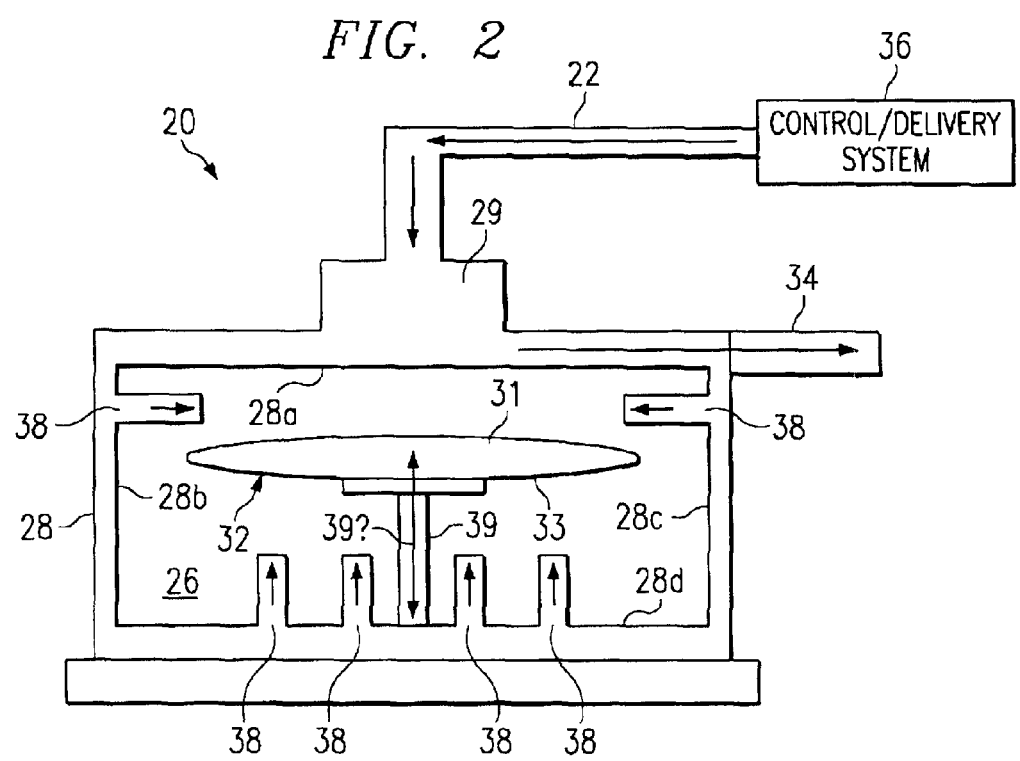
FIG. 2 illustrates a cross section of the transfer chamber oxide removal portion of the integrated oxide removal and processing system.

FIG. 2 illustrates a cross section of the transfer chamber oxide removal module 20 of the integrated oxide removal and processing system. Transfer chamber oxide removal module 20 includes a vapor ingress channel 22, a chamber 26, a frame 28, a channel 29, a wafer support 39, an egress 34, and a control/delivery system 36. Transfer chamber oxide removal module 20 also includes a plurality of outlets 38. In operation, transfer chamber oxide removal module 20 discharges an amount of vaporous solution through vapor ingress 22 and channel 29 to one or more outlets 38 into chamber 26. The vaporous solution substantially and uniformly coats semiconductor wafer 32 so that all of an oxide layer is removed therefrom. The vaporous solution is then dried or removed from semiconductor wafer 32 to prepare semiconductor wafer 32 for processing in processing module 30.

Transfer chamber oxide removal module 20 may be suitably shaped and sized to provide vapor etching of semiconductor wafer 32, depending on the application and various parameters such as gas kinetics. Frame 28 is desirably constructed with noncorrosive materials, such as silicon carbide (SiC) or a synthetic resinous fluorine-containing polymer or polytetrafluoroethylene coating such as TEFLON™, with respect to the selected vaporous solution.

Frame 28 includes a channel 29 suitably large to direct vapor and/or gas flow to one or more outlets 38. Frame 28 also includes suitable closeable apertures, such as slits (not explicitly shown), for insertion and removal of semiconductor wafer 32. These apertures may be slidably, rotatably, or otherwise, closed or sealed to sufficiently contain vaporous solution within chamber 26 for oxide removal.

Control/delivery system 36 is operable to deliver the amount of vaporous solution by a variety of methods. For example, control/delivery system 36 may include a bubbler or vaporizer that converts gas to vapor form, which is then directed through ingress channel 22 to outlets 38. Alternatively, gas may travel through ingress channel 22 and may be converted to vapor form at each of outlets 38. Control/delivery system 36 may include automatic or manual controls or a combination thereof. Control/delivery system 36 may utilize a variety of delivery parameters, depending on factors such as gas kinetics, to deliver an amount of vaporous solution sufficient to substantially uniformly coat semiconductor wafer 32 so that all of an oxide layer is removed therefrom. Control/delivery system 36 may also control egress of the vapor solution by a variety of methods, such as valves located at a portion of egress 38 or a drain (not explicitly shown) located in bottom portion 28d of frame 28.

The configuration of outlets 38 may depend on the gas kinetics used. Any number of outlets 38 may be disposed in a variety of configurations around frame 28, including top portion 28a, side portions 28b–c, bottom portion 28d, or any combination thereof. In some applications, it may be desirable to provide uniform removal of oxidation from either or both a top side 31 or a bottom side 33 of wafer 22. Where, for example, bottom side 33 of semiconductor wafer 32 may have been corrupted as a result of storage or contact with a variety of surfaces, it may be desirable to remove an oxide layer from bottom side 33 of semiconductor wafer 32 for further processing such as lithography. As illustrated in FIG. 2, transfer chamber oxide removal module 20 includes six outlets 38. A single outlet 38 is disposed on each side portion 28b–c of frame 28, and four outlets 38 are disposed on a bottom portion of 28d. Outlets 38 may be arranged in any suitable fashion, including a linear or staggered array.

Wafer support 39 desirably provides a stable support for semiconductor wafer 32 while semiconductor wafer 32 undergoes oxidation removal, alignment, and/or centering. Wafer support 39 may also be operable to rotate about axis 39l to facilitate uniform coating and/or subsequent spin-drying of semiconductor wafer 32 after oxide removal therefrom. Wafer support 39 may also be constructed using a variety of known methods, desirably using noncorrosive materials.

The vaporous solution may vary in concentration depending on the application. For example, various oxide deposits may be more porous than thermally grown oxides, which are typically dense and are removed at a slower rate than are porous deposits. Furthermore, although higher concentrations may more quickly remove an oxidation layer, depending on such parameters as delivery systems or gas kinetics, it may be desirable to use a lower concentration. A lower concentration may require more time to complete the oxide removal process, but may desirably minimize consumption of materials used to form the vaporous solution. These parameters may be traded off as desired. In some applications, transfer chamber oxide removal portion 20 may utilize a HF concentration in the range of 0.049% to 49%.

After the oxide layer has been removed from semiconductor wafer 32, semiconductor wafer 32 may be prepared for processing in processing module 30. Chamber 26 may be evacuated and semiconductor wafer 32 may be spun-dried to remove the vaporous solution therefrom. Alternatively or in addition, semiconductor wafer 32 may be rinsed (e.g., with a water ($H_2O$) rinse). After semiconductor wafer 32 has been thus prepared, it may be transferred to process module 30.

Figure 3A:
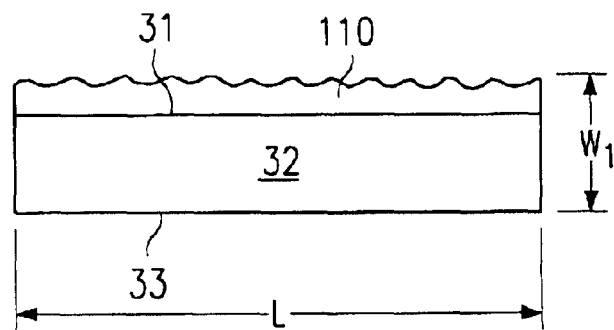
FIGS. 3A through 3C graphically illustrate the processing of a semiconductor wafer that may be performed by the integrated oxide removal and processing system.
Figure 3B:
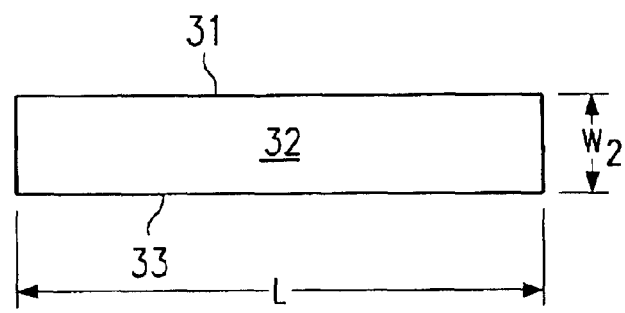
Figure 3C:
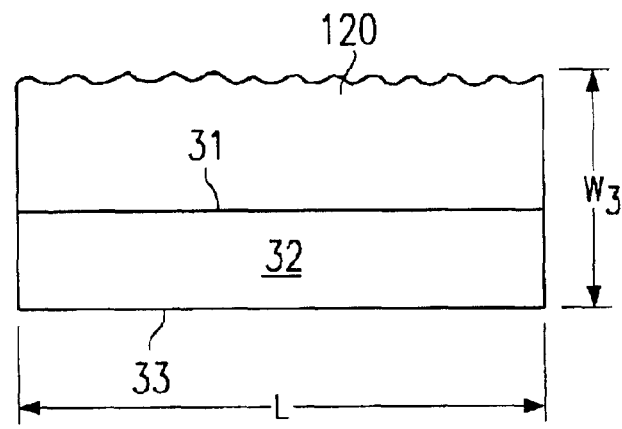

FIGS. 3A through 3C graphically illustrate the processing of a semiconductor wafer that may be performed by the integrated oxide removal and processing system. As discussed previously, semiconductor wafer 32 may be inserted into transfer chamber oxide removal module 20 to await film deposition or growth in process module 30 (a first step). Transfer chamber oxide removal module 20 may then be used to etch away any interfacial oxide portion that has been formed on either top surface 31 and/or bottom side 33 of semiconductor wafer 32 (a second step). Immediately after the etching process, semiconductor wafer 32 may be moved from transfer chamber oxide removal module 20 to process module 30, in which one or more layers of film may be deposited, or grown thereon (a third step). As desired, semiconductor wafer 32 may also be transferred back to transfer chamber oxide removal module 20 to remove any chemical or other natural interfacial oxide layers that may have been formed between any film layers (i.e., return to steps one and two). These processing steps avoid the use of unnecessary steps, and desirably reduces particles and/or defects on top surface 31 and/or bottom side 33. This advantage provides for cleaner surfaces of semiconductor wafer 32, and may enhance the yield of the resultant microelectronic device.

FIG. 3A graphically illustrates a cross-section of semiconductor wafer 32 and interfacial oxide layer 110 at the first step in processing. Interfacial oxide layer 110 is of an unknown composition, and is generally nonuniformly disposed along length L over top surface 31 of semiconductor wafer 32. Although not illustrated in FIG. 3A, a separate interfacial oxide layer 110 may also similarly be generally disposed along bottom surface 33 of semiconductor wafer 32.

Semiconductor wafer 32 and interfacial oxide layer 110 combine to form a maximum width $W_1$. Because interfacial oxide layer 110 is not uniformly distributed along length L, width $W_1$ along length L is indeterminate and varying. Furthermore, the presence of interfacial oxide layer 110 interferes with the ability for a film layer to adequately establish and/or maintain contact with semiconductor wafer 32. Each of these problems caused by the presence of interfacial oxide layer 110 detrimentally affects the electrical and physical properties of a resultant microelectronic device.

FIG. 3B graphically illustrates semiconductor wafer 32 after the etch process within transfer chamber oxide removal module 20 is complete at the second step in processing. After removal of interfacial oxide layer 110, semiconductor wafer 32 has a maximum width $W_2$, which is relatively uniformly distributed along length L. Because the vaporous solution used in transfer chamber oxide removal module 20 is inert with respect to semiconductor wafer 32, the oxide removal process does not affect top surface 31 and/or bottom side 33. Thus, top surface 31 and/or bottom side 33 may be as uniformly smooth a surface as originally manufactured. Width $W_2$ may be much smaller than the maximum width $W_1$ formed by the combination of interfacial oxide layer 110 and semiconductor wafer 32, depending on the width of interfacial oxide layer 110.

FIG. 3C graphically illustrates semiconductor wafer 32 with a single film layer 120 deposited or grown thereon at the third step in processing. The combined width $W_3$ of semiconductor wafer 32 and single film layer 120 is smaller and more uniformly distributed along length L after the removal of interfacial oxide layer 110. In addition, single film layer 120 encounters lower contact resistance to semiconductor wafer 32, which may result in improved electrical properties of the microelectronic device, such as an increased dielectric constant and reduced current leakage. This reduction in current leakage is typically desirable for most microelectronic devices, such as dynamic read access memory (DRAM) devices.

The process graphically illustrated by FIGS. 3A through 3C may also be repeated between further intentional deposition and/or growth of one or more additional film layers 120. Each removal of interfacial oxide layer 110 further reduces the thickness and non-uniformity within each film layer and the final microelectronic device and improves operational quality of the device.

Thus, it is apparent that there has been provided in accordance with the present invention, an integrated oxide removal system and method that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. An integrated oxide removal and processing system, comprising:
   a process module operable to intentionally add at least one film layer to a single semiconductor wafer; and
   a transfer chamber module coupled to the process module, the transfer chamber module used to align the semiconductor wafer for the process module, the transfer chamber module operable to expose the semiconductor wafer to a vaporous solution, the vaporous solution substantially inert with respect to the semiconductor wafer and operable to remove an interfacial oxide layer therefrom prior to or after the intentional addition of the at least one film layer.

2. The system of claim 1, wherein the semiconductor wafer comprises silicon.

3. The system of claim 1, wherein the oxide layer is a chemical oxide.

4. The system of claim 1, wherein the transfer chamber module comprises one of the group consisting of a synthetic resinous fluorine-containing polymer, polytetrafluoroethylene coating, and silicon carbide.

5. The system of claim 1, wherein the at least one film layer comprises one of the group consisting of $SiO_2$, epitaxial Si, polysilicon, and nitride.

6. The system of claim 1, wherein the vaporous solution comprises HF.

7. The system of claim 1, wherein the vaporous solution comprises 0.049% to 49% HF.

8. An integrated oxide removal and transfer chamber, comprising:
   a chamber operable to hold and align a single semiconductor wafer for presentation to a process module;
   a wafer support enclosed within the chamber; and
   a plurality of outlets operable to discharge an amount of a vaporous solution into the chamber, the vaporous solution substantially inert with respect to the wafer support and the semiconductor wafer and operable to remove an oxide layer from at least one surface of the semiconductor wafer.

9. The integrated oxide removal and transfer chamber of claim 8, wherein the chamber comprises one of the group consisting of a synthetic resinous fluorine-containing polymer, polytetrafluoroethylene coating, and silicon carbide.

10. The integrated oxide removal and transfer chamber of claim 8, wherein the semiconductor wafer comprises silicon.

11. The integrated oxide removal and transfer chamber of claim 8, wherein the wafer support is rotatable.

12. The integrated oxide removal and transfer chamber of claim 8, wherein the vaporous solution comprises HF.

13. The integrated oxide removal and transfer chamber of claim 8, wherein the vaporous solution comprises 0.049% to 49% HF.

* * * * *